United States Patent
Takeuchi et al.

(10) Patent No.: US 9,300,255 B2
(45) Date of Patent: Mar. 29, 2016

(54) RADIO COMMUNICATION CIRCUIT AND RADIO COMMUNICATION APPARATUS

(71) Applicant: FUJITSU LIMITED, Kawasaki-shi, Kanagawa (JP)

(72) Inventors: Yasuaki Takeuchi, Sapporo (JP); Yusuke Yamamori, Sapporo (JP); Yasuhiro Murakami, Sapporo (JP); Takashi Tanii, Sapporo (JP); Mikio Hayashihara, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 22 days.

(21) Appl. No.: 14/451,288

(22) Filed: Aug. 4, 2014

(65) Prior Publication Data

US 2015/0048890 A1    Feb. 19, 2015

(30) Foreign Application Priority Data

Aug. 15, 2013 (JP) .................. 2013-168942

(51) Int. Cl.
| | | |
|---|---|---|
| *H03G 3/20* | (2006.01) | |
| *H03F 1/32* | (2006.01) | |
| *H03F 3/19* | (2006.01) | |
| *H03F 1/02* | (2006.01) | |
| *H03F 3/189* | (2006.01) | |
| *H03F 3/24* | (2006.01) | |

(52) U.S. Cl.
CPC ............... *H03F 1/32* (2013.01); *H03F 1/0227* (2013.01); *H03F 3/189* (2013.01); *H03F 3/19* (2013.01); *H03F 3/245* (2013.01); *H03F 2200/102* (2013.01); *H03F 2200/336* (2013.01); *H03F 2200/375* (2013.01); *H03F 2200/451* (2013.01)

(58) Field of Classification Search
CPC ........................ H03F 1/0222; H03F 1/0233
USPC ................... 330/127, 136; 455/127.1
See application file for complete search history.

(56) References Cited

U.S. PATENT DOCUMENTS

| | | | | |
|---|---|---|---|---|
| 8,909,175 | B1 * | 12/2014 | McCallister | .......... H04L 27/368 330/127 |
| 2004/0021516 | A1 | 2/2004 | Oishi | |
| 2006/0234652 | A1 | 10/2006 | Oka | |

FOREIGN PATENT DOCUMENTS

| | | |
|---|---|---|
| JP | 2001-160718 A | 6/2001 |
| JP | 2008-172544 A | 7/2008 |
| JP | 2011-188120 A | 9/2011 |
| WO | 2002/061938 A1 | 8/2002 |
| WO | 2006/101094 A1 | 9/2006 |

* cited by examiner

*Primary Examiner* — Steven J Mottola
(74) *Attorney, Agent, or Firm* — Maschoff Brennan

(57) ABSTRACT

A radio communication circuit includes a power amplifier configured to amplify a signal and output the amplified signal, an envelope detector configured to extract an envelope of an input signal inputted to the power amplifier, an offset generator configured to generate an offset value for a power supply voltage to be applied to the power amplifier, based on a distortion amount in an output signal from the power amplifier, and a power supply voltage modulator configured to control the power supply voltage to be applied to the power amplifier based on the envelope extracted and the offset value generated.

14 Claims, 10 Drawing Sheets

FIG. 9

| DISTORTION-AMOUNT DIFFERENCE (dB) | OFFSET VALUE (V) |
|---|---|
| -5 | -0.5 |
| -4 | -0.4 |
| -3 | -0.3 |
| -2 | -0.2 |
| -1 | -0.1 |
| 0 | 0 |
| 1 | 0.1 |
| 2 | 0.2 |
| 3 | 0.3 |
| 4 | 0.4 |
| 5 | 0.5 |

RADIO COMMUNICATION CIRCUIT AND RADIO COMMUNICATION APPARATUS

CROSS-REFERENCE TO RELATED APPLICATION

This application is based upon and claims the benefit of priority of the prior Japanese Patent Application No. 2013-168942, filed on Aug. 15, 2013, the entire contents of which are incorporated herein by reference.

FIELD

The embodiments discussed herein are related to a radio communication circuit and a radio communication apparatus.

BACKGROUND

Envelope tracking is one of conventional techniques for controlling a power supply voltage to be supplied to a power amplifier used in an apparatus such as a radio communication apparatus. In the envelope tracking technique, the power supply voltage to be supplied to the power amplifier is controlled based on envelope information on an input signal to be amplified by the power amplifier. Such a technique is described in, for example, Japanese Laid-open Patent Publication No. 2011-188120.

SUMMARY

According to an aspect of the invention, a radio communication circuit includes a power amplifier configured to amplify a signal and output the amplified signal, an envelope detector configured to extract an envelope of an input signal inputted to the power amplifier, an offset generator configured to generate an offset value for a power supply voltage to be applied to the power amplifier, based on a distortion amount in an output signal from the power amplifier, and a power supply voltage modulator configured to control the power supply voltage to be applied to the power amplifier based on the envelope extracted and the offset value generated.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 9 is a diagram illustrating an example of a table used in the distortion judgment circuit illustrated in FIG. 7.

DESCRIPTION OF EMBODIMENTS

Figure 1:
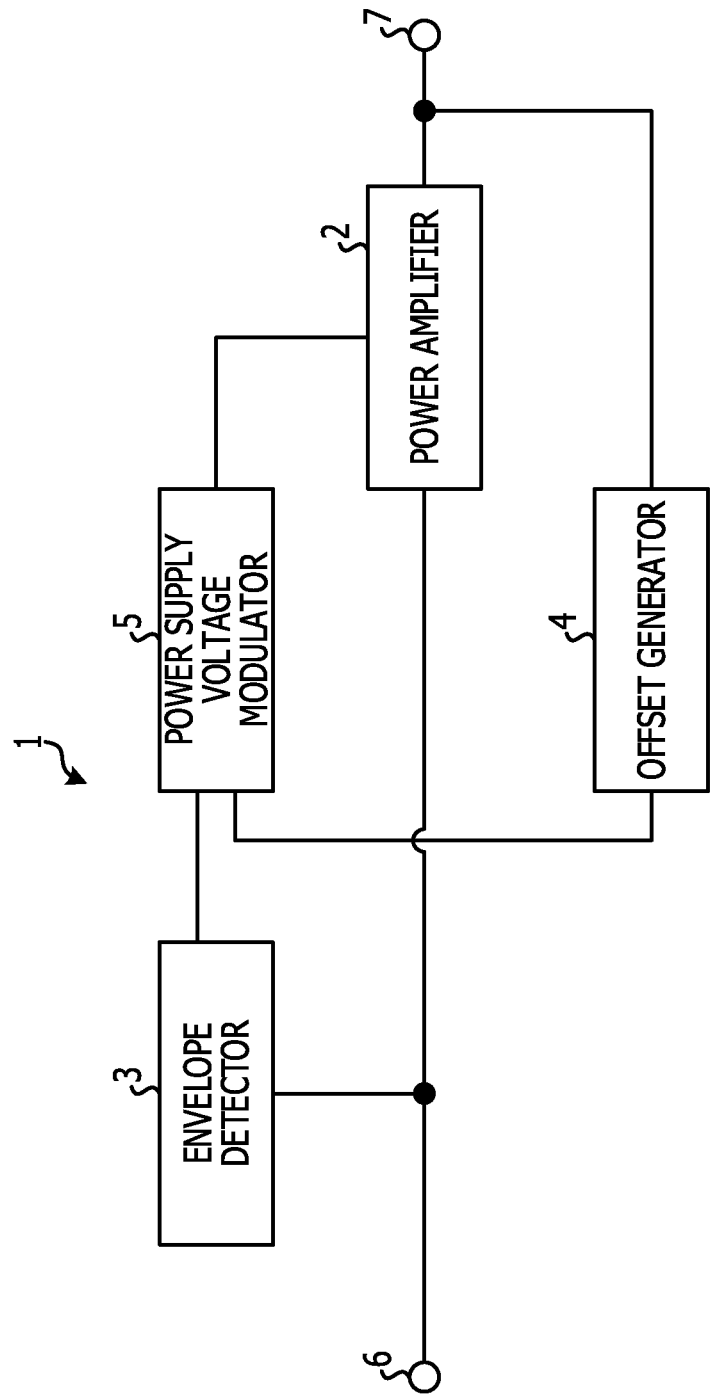
FIG. 1 is a diagram illustrating a first example of a radio communication circuit according to an embodiment.

Although distortion characteristics vary among individual power amplifiers, the conventional envelope tracking technique fails to cope with the variations among the individual power amplifiers. Hence, it is desired that each power amplifier be supplied with a power supply voltage having a margin that may absorb those variations. Such margin of the power supply voltage leads to a problem of low power efficiency.

Provided are a radio communication circuit and a radio communication apparatus capable of controlling a power supply voltage to be supplied to a power amplifier in accordance with distortion characteristics specific to the power amplifier.

With reference to the drawings attached hereto, preferred embodiments of a radio communication circuit and a radio communication apparatus are described in detail below. Throughout the following description of examples of the embodiments, the same reference numerals are given to similar components, and those components are described only once.

First Example of Radio Communication Circuit

Figure 2:
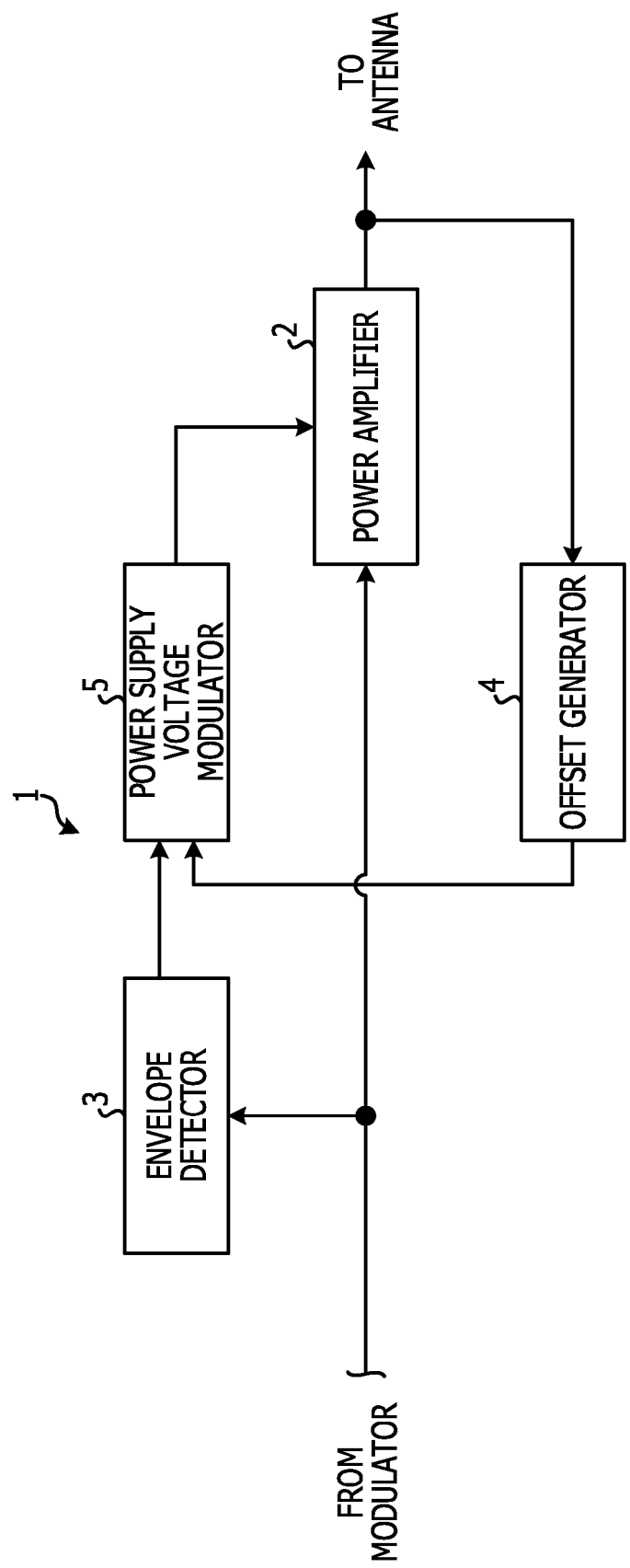
FIG. 2 is a diagram illustrating an example of a signal flow in the radio communication circuit illustrated in FIG. 1.

FIG. 1 is a diagram illustrating a first example of a radio communication circuit according to an embodiment. FIG. 2 is a diagram illustrating an example of a signal flow in the radio communication circuit illustrated in FIG. 1. As illustrated in FIGS. 1 and 2, a radio communication circuit 1 has a power amplifier 2, an envelope detector 3, an offset generator 4, and a power supply voltage modulator 5. The radio communication circuit 1 is a circuit which is used for radio communication and which performs signal processing on the transmitting side.

An input of the power amplifier 2 is connected to an input terminal 6 of the radio communication circuit 1. The power amplifier 2 amplifies a signal inputted to the input terminal 6 of the radio communication circuit 1 and outputs the amplified signal. For example, a modulator (not shown) may input a radio frequency (RF) signal to the input terminal 6 of the radio communication circuit 1, the RF signal being obtained by modulation of a carrier wave by use of a baseband signal.

An output of the power amplifier 2 is connected to an output terminal 7 of the radio communication circuit 1. The signal amplified by the power amplifier 2 is outputted from the output terminal 7 of the radio communication circuit 1. For example, an antenna may be connected to the output terminal 7 of the radio communication circuit 1. For instance, the RF signal inputted from the modulator (not shown) to the radio communication circuit 1 may be given out to the air from the antenna (not shown) after being amplified by the power amplifier 2.

The envelope detector 3 is connected to the input terminal 6 of the radio communication circuit 1. The envelope detector 3 extracts an envelope amplitude waveform of the signal to be inputted to the power amplifier 2. The envelope detector 3 may extract the envelope amplitude waveform by using, for example, a known technique.

The offset generator 4 is connected to the output terminal 7 of the radio communication circuit 1. The offset generator 4 detects a distortion amount in the output signal from the power amplifier 2, and based on the detected distortion amount, generates an offset value for a power supply voltage to be applied to the power amplifier 2.

The power supply voltage modulator 5 is connected to the envelope detector 3 and to the offset generator 4. From the envelope detector 3, the power supply voltage modulator 5 receives input of information on the envelope amplitude waveform extracted by the envelope detector 3. In addition, from the offset generator 4, the power supply voltage modulator 5 receives input of the offset value generated by the offset generator 4. The power supply voltage modulator 5 uses the envelope amplitude waveform and the offset value to control the power supply voltage to be applied to the power amplifier 2 by envelope tracking.

The power amplifier 2, the envelope detector 3, the offset generator 4, and the power supply voltage modulator 5 may be implemented by hardware. In addition, part of the processing for detecting the distortion amount in the output signal from the power amplifier 2 or part of the processing for generating the offset value may be implemented by a processor executing software.

According to the radio communication circuit 1 illustrated in FIG. 1, the envelope amplitude waveform of the input signal to the power amplifier 2 is corrected by the offset value which is associated with the distortion amount in the output signal from the power amplifier 2. Thus, when envelope tracking is used in supply of a power supply voltage to the power amplifier 2, the power supply voltage may be controlled in accordance with the distortion characteristics specific to the power amplifier 2. Accordingly, unlike the conventional technique, there is no desire to give a margin that may absorb the variations in the distortion characteristics among individual power amplifiers to the power supply voltage supplied to the power amplifier 2. Thus, an advantageous effect of improved power efficiency may be attained.

Example of the Radio Communication Apparatus

Figure 3:
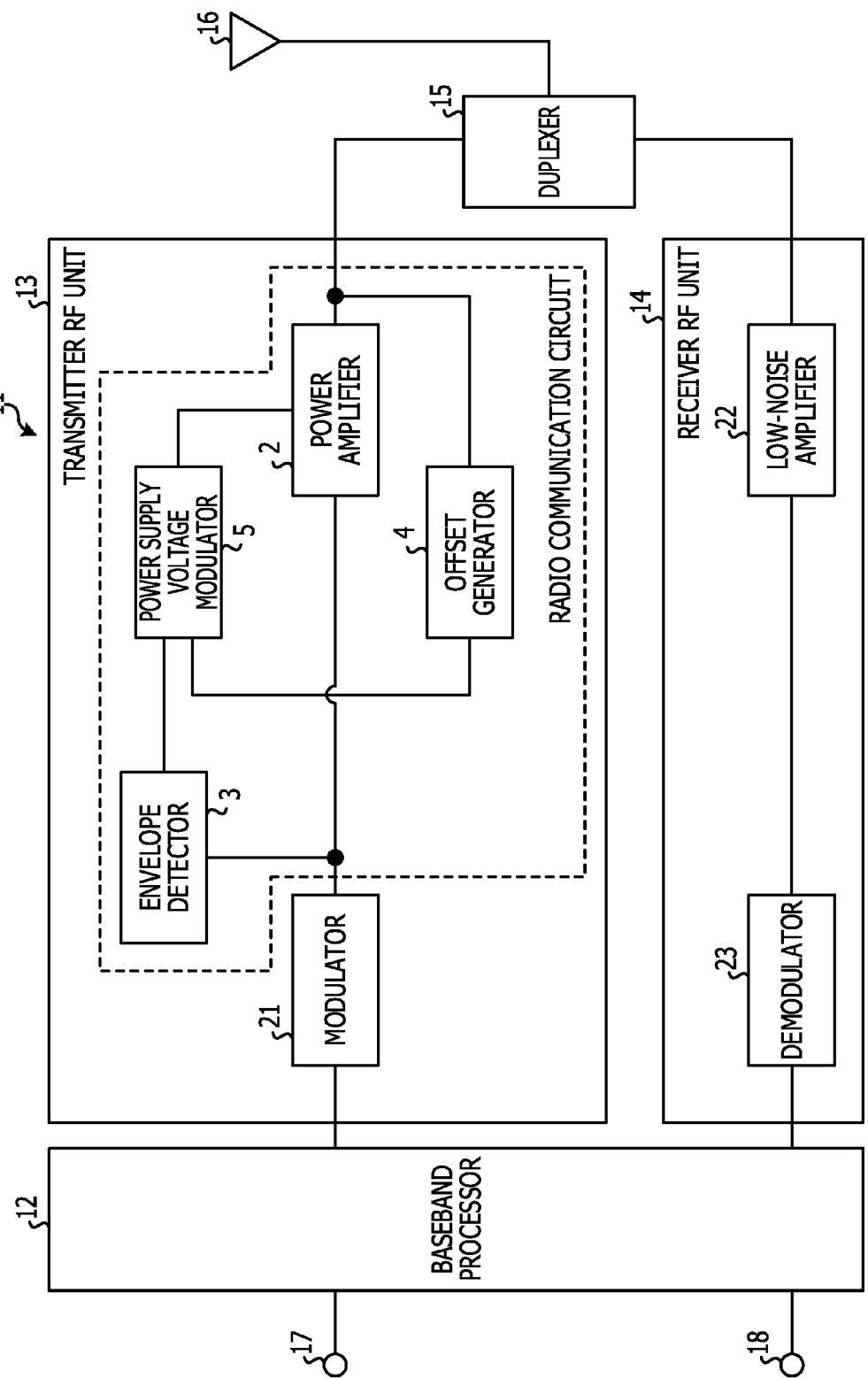
FIG. 3 is a diagram illustrating an example of a radio communication apparatus according to an embodiment.
Figure 4:
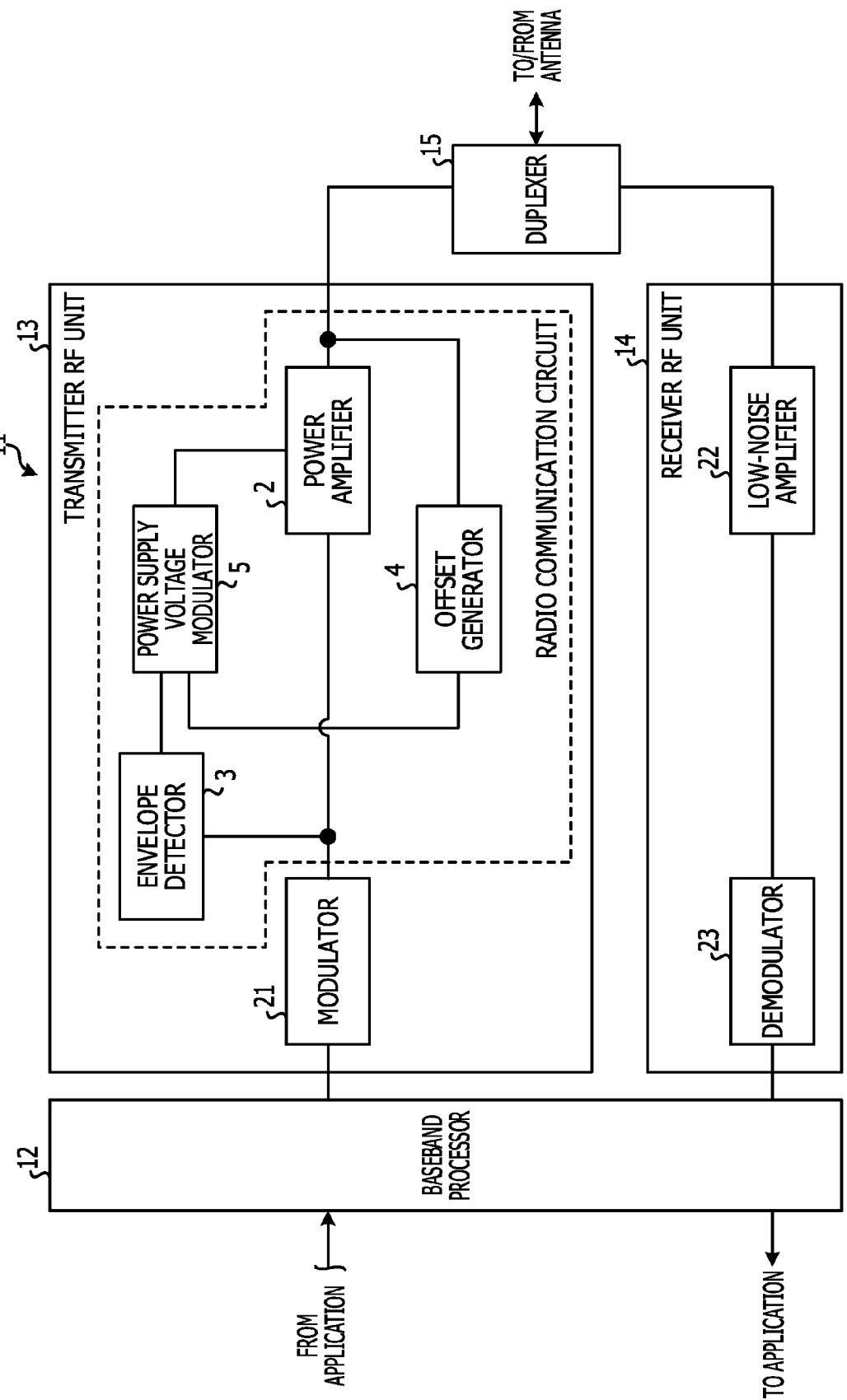
FIG. 4 is a diagram illustrating an example of a signal flow in the radio communication apparatus illustrated in FIG. 3.

FIG. 3 is a diagram illustrating an example of the radio communication apparatus according to an embodiment. FIG. 4 is a diagram illustrating an example of a signal flow in the radio communication apparatus illustrated in FIG. 3. As illustrated in FIGS. 3 and 4, a radio communication apparatus 11 may have, for example, a baseband processor 12, a transmitter RF unit 13, a receiver RF unit 14, a duplexer 15, and an antenna 16. The radio communication apparatus 11 may be a radio communication apparatus such as, for example, a base station or a portable terminal including a mobile phone, a smartphone, or a tablet.

The baseband processor 12 is connected to an input terminal 17 and an output terminal 18 of the radio communication apparatus 11. For example, the input terminal 17 of the radio communication apparatus 11 may receive input of transmission data from an application processor (not shown). The baseband processor 12 performs processing such as, for example, error-correction coding and mapping on the transmission data passed from the application processor. A transmission signal processed by the baseband processor 12 is sent to the transmitter RF unit 13.

The baseband processor 12 is also connected to the receiver RF unit 14. The baseband processor 12 performs processing such as demapping and error-correction decoding on a baseband signal passed from the receiver RF unit 14. Reception data processed by the baseband processor 12 is passed through the output terminal 18 of the radio communication apparatus 11 to the application processor.

The transmitter RF unit 13 converts the transmission signal passed from the baseband processor 12 into a signal in the radio frequency range. The transmitter RF unit 13 may have a modulator 21 and the radio communication circuit 1 described above for example. The radio communication circuit 1 may have the power amplifier 2, the envelope detector 3, the offset generator 4, and the power supply voltage modulator 5. Since the power amplifier 2, the envelope detector 3, the offset generator 4, and the power supply voltage modulator 5 are as described in the first example of the radio communication circuit illustrated in FIG. 1, they are not described again here.

The modulator 21 is connected to the baseband processor 12. The modulator 21 obtains an RF signal by modulating a carrier wave with the baseband transmission signal passed from the baseband processor 12 and outputs the RF signal. The RF signal outputted from the modulator 21 is passed to the power amplifier 2 and the envelope detector 3 of the radio communication circuit 1.

The RF signal outputted from the modulator 21 is sent to the antenna 16 via the duplexer 15, and is given out to the air from the antenna 16. The duplexer 15 is connected to the power amplifier 2, and the antenna 16 is connected to the duplexer 15.

The receiver RF unit 14 converts a reception signal in the radio frequency range received at the antenna 16 and passed to the receiver RF unit 14 via the duplexer 15, into a baseband signal. The receiver RF unit 14 may have a low-noise amplifier 22 and a demodulator 23.

The low-noise amplifier 22 is connected to the duplexer 15. The low-noise amplifier 22 amplifies the reception signal passed from the duplexer 15. The demodulator 23 is connected to the low-noise amplifier 22. The demodulator 23 obtains a baseband signal by demodulating the reception signal in the radio frequency range passed from the low-noise amplifier 22 and outputs the baseband signal. The baseband signal outputted from the demodulator 23 is passed to the baseband processor 12.

According to the radio communication apparatus 11 illustrated in FIG. 3, the envelope amplitude waveform of the input signal to the power amplifier 2 is corrected by the offset value corresponding to the distortion amount in the output signal from the power amplifier 2. Thus, when envelope tracking is used in supply of a power supply voltage to the power amplifier 2, the power supply voltage may be controlled in accordance with the distortion characteristics specific to the power amplifier 2. Accordingly, unlike the conventional technique there is no desire to give a margin that may absorb variations in the distortion characteristics among individual power amplifiers to the power supply voltage supplied to the power amplifier 2. Thus, an advantageous effect of improved power efficiency may be attained.

Second Example of the Radio Communication Circuit

Figure 5:
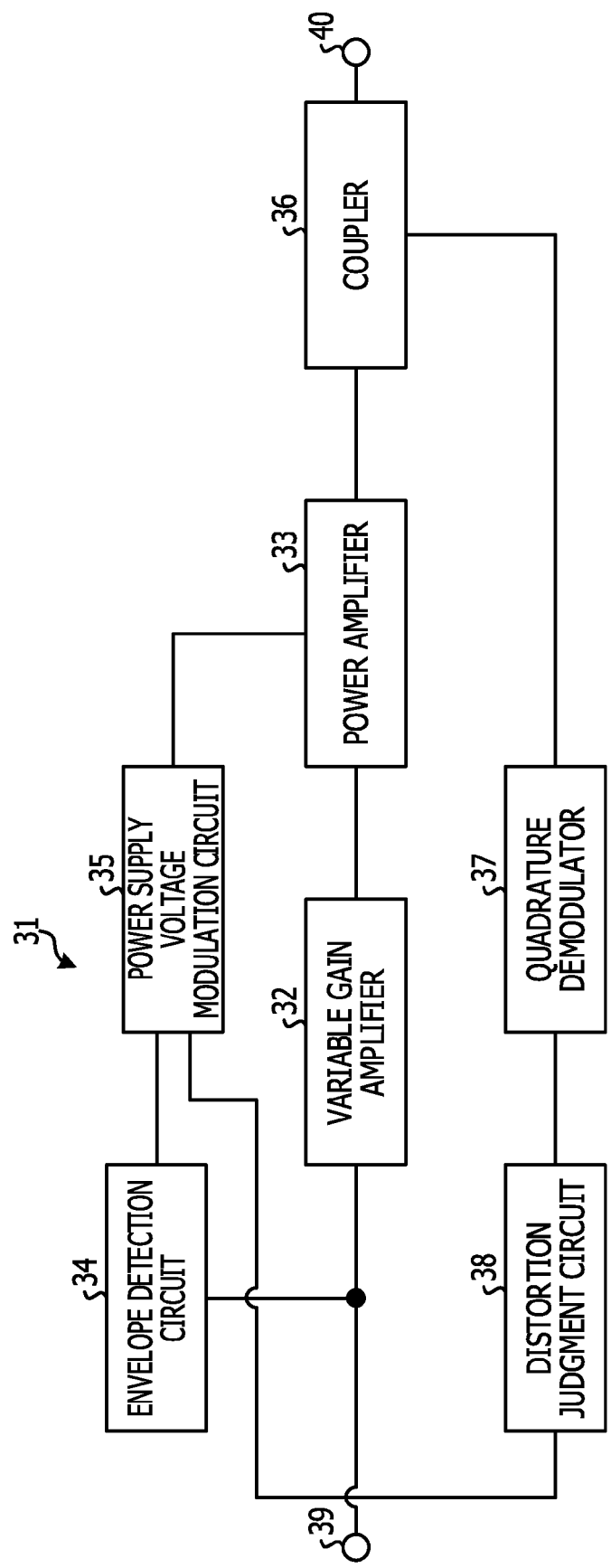
FIG. 5 is a diagram illustrating a second example of the radio communication circuit according to an embodiment.
Figure 6:
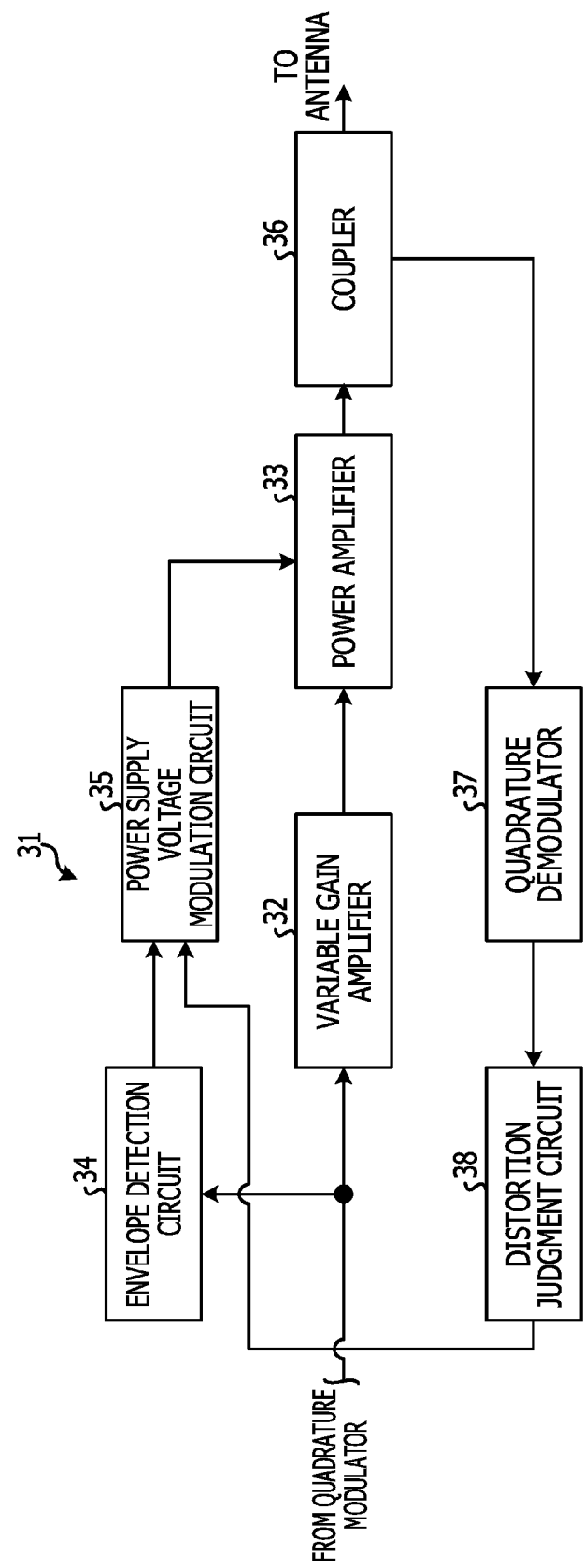
FIG. 6 is a diagram illustrating an example of a signal flow in the radio communication circuit illustrated in FIG. 5.

FIG. 5 is a diagram illustrating a second example of the radio communication circuit according to an embodiment. FIG. 6 is a diagram illustrating an example of a signal flow in the radio communication circuit illustrated in FIG. 5. As illustrated in FIGS. 5 and 6, a radio communication circuit 31 has a variable gain amplifier 32, a power amplifier 33, an envelope detection circuit 34, a power supply voltage modulation circuit 35, a coupler 36, a quadrature demodulator 37, and a distortion judgment circuit 38.

The radio communication circuit 31 is a circuit which is used for radio communication and which performs signal processing on the transmitting side. The radio communication circuit 31 may be a radio communication circuit used in a radio communication apparatus configured to perform quadrature modulation and quadrature demodulation. For example, the radio communication circuit 31 may be a radio communication circuit supporting Wideband Code Division Multiple Access (WCDMA, registered trademark). In the second example of the radio communication circuit, the radio communication circuit 31 is described as one supporting WCDMA.

An input of the variable gain amplifier 32 is connected to an input terminal 39 of the radio communication circuit 31. The variable gain amplifier 32 amplifies a signal inputted to the input terminal 39 of the radio communication circuit 31 with the gain adjusted so that the transmission power level may become a desired value, and outputs the signal thus amplified. The input terminal 39 of the radio communication circuit 31 may receive input of an RF signal for example from a quadrature modulator (not shown), the RF signal being obtained by modulating a carrier wave with a baseband signal.

An input of the power amplifier 33 is connected to an output of the variable gain amplifier 32. The power amplifier 33 amplifies the signal outputted from the variable gain amplifier 32 and outputs the amplified signal. The power amplifier 33 is an example of a power amplifier. An output of the power amplifier 33 is connected to a splitter such as the coupler 36.

The coupler 36 splits the signal outputted from the power amplifier 33, to an output terminal 40 of the radio communication circuit 31 and to the quadrature demodulator 37. The output terminal 40 of the radio communication circuit 31 may be connected to, for example, an antenna. Part of the signal split by the coupler 36 and outputted to the output terminal 40 of the radio communication circuit 31 may be given out to the air from the antenna (not shown).

The quadrature demodulator 37 is connected to the coupler 36. The quadrature demodulator 37 obtains a baseband signal by performing quadrature demodulation on the other part of the signal split by the coupler 36 and outputted to the quadrature demodulator 37 and outputs the baseband signal.

The distortion judgment circuit 38 is connected to the quadrature demodulator 37. The distortion judgment circuit 38 detects a distortion amount in the output signal from the power amplifier 33 based on the output signal from the quadrature demodulator 37, and then based on the detected distortion amount, generates an offset value for the power supply voltage to be applied to the power amplifier 33. Details of the distortion judgment circuit 38 will be given later. The quadrature demodulator 37 and the distortion judgment circuit 38 are an example of an offset generator.

The envelope detection circuit 34 is connected to the input terminal 39 of the radio communication circuit 31. The envelope detection circuit 34 extracts an envelope amplitude waveform of a signal inputted to the variable gain amplifier 32. The envelope detection circuit 34 may extract the envelope amplitude waveform by use of, for example, a known technique. The envelope detection circuit 34 is an example of an envelope detector.

The power supply voltage modulation circuit 35 is connected to the envelope detection circuit 34 and to the distortion judgment circuit 38. From the envelope detection circuit 34, the power supply voltage modulation circuit 35 receives input of information on the envelope amplitude waveform extracted by the envelope detection circuit 34. In addition, from the distortion judgment circuit 38, the power supply voltage modulation circuit 35 receives input of the offset value generated by the distortion judgment circuit 38. Based on the envelope amplitude waveform and the offset value, the power supply voltage modulation circuit 35 controls the power supply voltage to be applied to the power amplifier 33 by envelope tracking. The power supply voltage modulation circuit 35 is an example of a power supply voltage modulator.

The variable gain amplifier 32, the power amplifier 33, the envelope detection circuit 34, the power supply voltage modulation circuit 35, the coupler 36, the quadrature demodulator 37, and the distortion judgment circuit 38 may be implemented by hardware. In addition, part of the processing for detecting the distortion amount in the output signal from the power amplifier 33 or part of the processing for generating the offset value, both performed by the distortion judgment circuit 38, may be implemented by a processor executing software.

Figure 7:
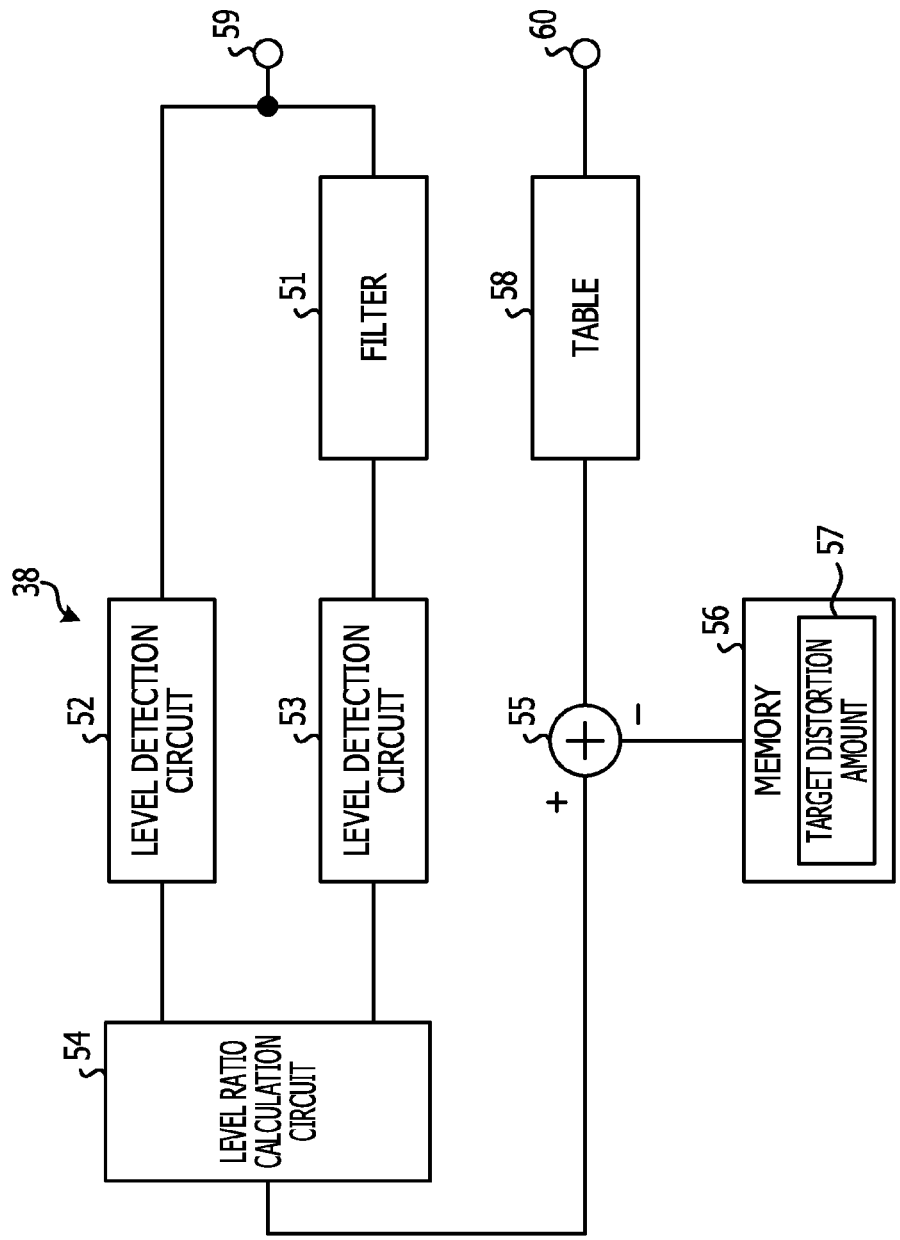
FIG. 7 is a diagram illustrating an example of a distortion judgment circuit in the radio communication circuit illustrated in FIG. 5.
Figure 8:
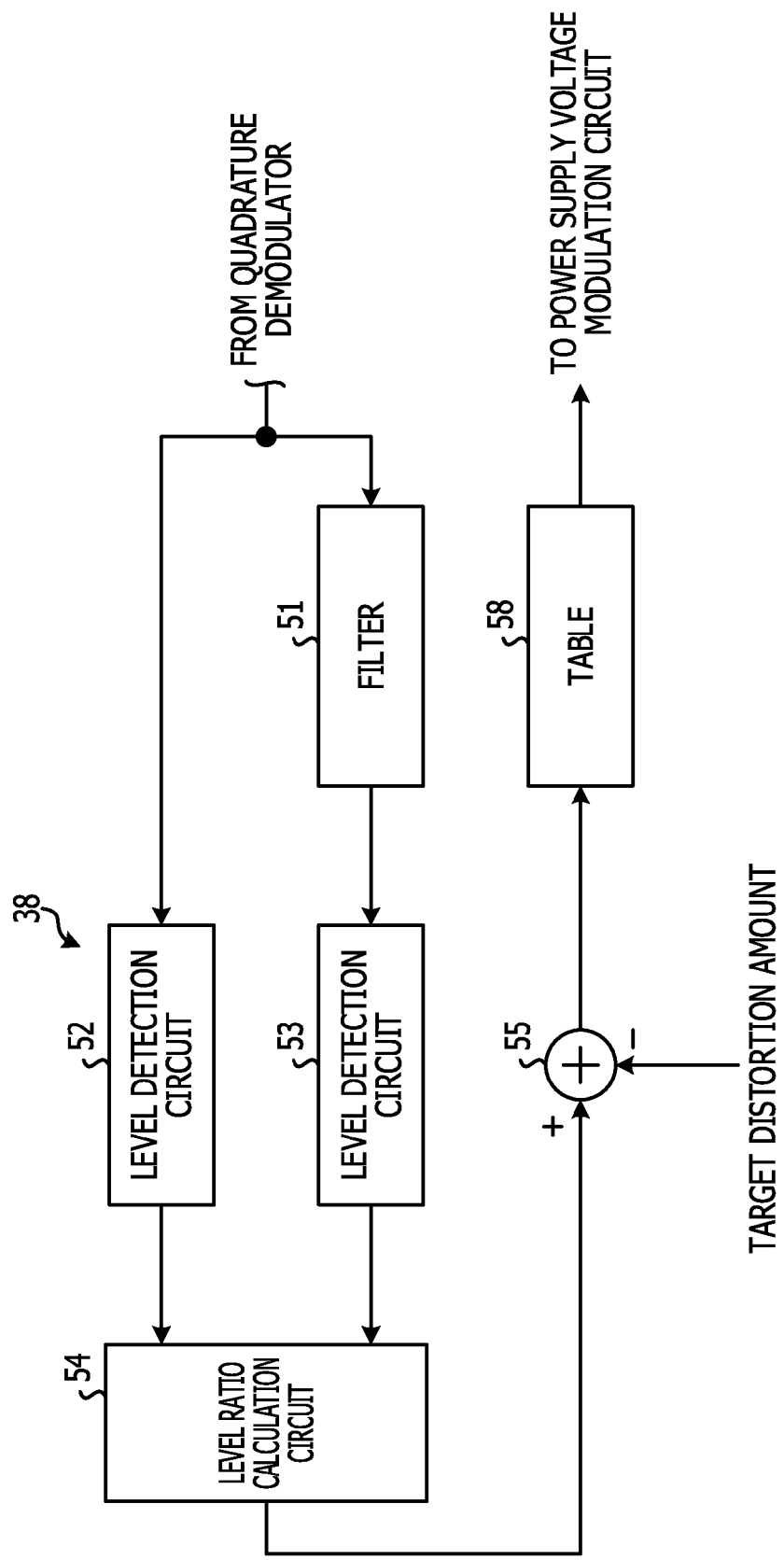
FIG. 8 is a diagram illustrating an example of a signal flow in the distortion judgment circuit illustrated in FIG. 7.

FIG. 7 is a diagram illustrating an example of the distortion judgment circuit in the radio communication circuit illustrated in FIG. 5. FIG. 8 is a diagram illustrating an example of a signal flow in the distortion judgment circuit illustrated in FIG. 7. As illustrated in FIGS. 7 and 8, the distortion judgment circuit 38 may have a filter 51, two level detection circuits 52 and 53, a level ratio calculation circuit 54, a subtractor 55, a memory 56, and a table 58.

The level detection circuit 52, which is one of the two level detection circuits, is connected to an input terminal 59 of the distortion judgment circuit 38. The input terminal 59 of the distortion judgment circuit 38 receives input of the baseband signal from the quadrature demodulator 37. The level detection circuit 52 detects the total power of the baseband signal inputted from the quadrature demodulator 37. The level detection circuit 52 may measure the power level by use of, for example, a known technique.

The filter 51 is connected to the input terminal 59 of the distortion judgment circuit 38. From the baseband signal inputted from the quadrature demodulator 37, the filter 51 extracts a signal on a channel adjacent to a channel for the output signal from the power amplifier 33. The filter 51 may extract the signal on a channel adjacent to a channel for the output signal from the power amplifier 33 by use of, for example, a known technique.

The detuned frequency of the adjacent channel differs depending on the communication scheme. In WCDMA for example, the detuned frequency may be 5 MHz. Hence, in a case of WCDMA, the filter 51 may extract a signal which is detuned by 5 MHz from the carrier frequency of the output signal from the power amplifier 33.

The other level detection circuit 53 is connected to the filter 51. The level detection circuit 53 detects the power of the signal on the channel adjacent to the channel for the output signal from the power amplifier 33, which has been detected by the filter 51. In a case of WCDMA, the level detection circuit 53 may detect the power of a signal detuned by 5 MHz from the carrier frequency of the output signal from the power amplifier 33. The level detection circuit 53 may measure the power level by use of, for example, a known technique.

The level ratio calculation circuit 54 is connected to both of the level detection circuits 52 and 53. The level ratio calculation circuit 54 calculates the ratio of the power level detected by the one level detection circuit 52 to the power level detected by the other level detection circuit 53. In other words, the level ratio calculation circuit 54 calculates the ratio of the transmission power level of the radio communication circuit 31 to the power of the channel adjacent to the transmission channel.

Generally, when distortion occurs in the power amplifier 33, the distortion might cause spread of a spectrum into an adjacent frequency channel of a carrier-frequency channel. Such spread of the spectrum interferes with communication performed by another user using the adjacent channel. Thus, in the distortion judgment circuit 38, the ratio of the power of the carrier-frequency channel to the power of the spectrum leaked into the adjacent channel may be defined as distortion.

Thus, in other words, the level ratio calculation circuit 54 measures the amount of distortion occurring in the power amplifier 33.

The subtractor 55 is connected to the level ratio calculation circuit 54 and the memory 56. The memory 56 stores therein a target distortion amount 57. The target distortion amount 57 may be obtained by experiment or the like in advance in manufacturing, to satisfy a distortion amount set forth by law such as the Radio Law. The subtractor 55 calculates a difference between the distortion amount calculated by the level ratio calculation circuit 54 and the target distortion amount 57.

The table 58 is connected to the subtractor 55. The table 58 stores therein offset values each in association with a value of the difference between the distortion amount calculated by the level ratio calculation circuit 54 and the target distortion amount 57 (called a distortion-amount difference hereinbelow). Upon receipt of a distortion-amount difference from the subtractor 55, the table 58 outputs an offset value associated with the distortion amount difference. The table 58 may output the offset value in the form of an analog voltage corresponding to the offset value or in the form of a digitalized code value. The table 58 is connected to an output terminal 60 of the distortion judgment circuit 38, and the offset value outputted by the table 58 is given to the power supply voltage modulation circuit 35 via the output terminal 60 of the distortion judgment circuit 38.

FIG. 9 is a diagram illustrating an example of a table used in the distortion judgment circuit illustrated in FIG. 7. As illustrated in FIG. 9, the table 58 has offset values each associated with a value of the distortion-amount difference. The table 58 may be obtained by experiment or the like in advance in designing.

Although not particularly limited, in the example illustrated in FIG. 9 for instance, when the distortion-amount difference is 0 dB, an offset value associated therewith is 0 V. In addition, in the example illustrated in FIG. 9 for instance, offset values associated with the distortion-amount differences −5 dB, −4 dB, −3 dB, −2 dB, and −1 dB are −0.5 V, −0.4 V, −0.3 V, −0.2 V, and −0.1 V, respectively. Moreover, in the example illustrated in FIG. 9 for instance, offset values associated with the distortion-amount differences 1 dB, 2 dB, 3 dB, 4 dB, and 5 dB are 0.1 V, 0.2 V, 0.3 V, 0.4 V, and 0.5 V, respectively.

The power supply voltage modulation circuit 35 creates power-supply-voltage modulation information based on the envelope amplitude waveform. As in the example illustrated in FIG. 9, when the offset value for a negative distortion-amount difference is negative and the offset value for a positive distortion-amount difference is positive, the power supply voltage modulation circuit 35 modulates a power supply voltage to be applied to the power amplifier 33, based on information obtained by adding the offset value to the power voltage modulation information created.

Accordingly, when the distortion amount in the signal transmitted from the radio communication circuit 31 is smaller than the target distortion amount 57, the power supply voltage for the power amplifier 33 is decreased without the distortion amount exceeding the target distortion amount 57. On the other hand, when the distortion amount in the signal transmitted from the radio communication circuit 31 is larger than the target distortion amount 57, the power supply voltage for the power amplifier 33 is increased to an extent where the distortion amount falls within a range of the target distortion amount 57.

The filter 51, the level detection circuits 52 and 53, the level ratio calculation circuit 54, the subtractor 55, the memory 56, and the table 58 may be implemented by hardware. Alternatively, the level ratio calculation circuit 54 or the subtractor 55 may be implemented by a processor executing software. The processor reads each program from a memory, expands the program, and executes processes of the program sequentially.

Figure 10:
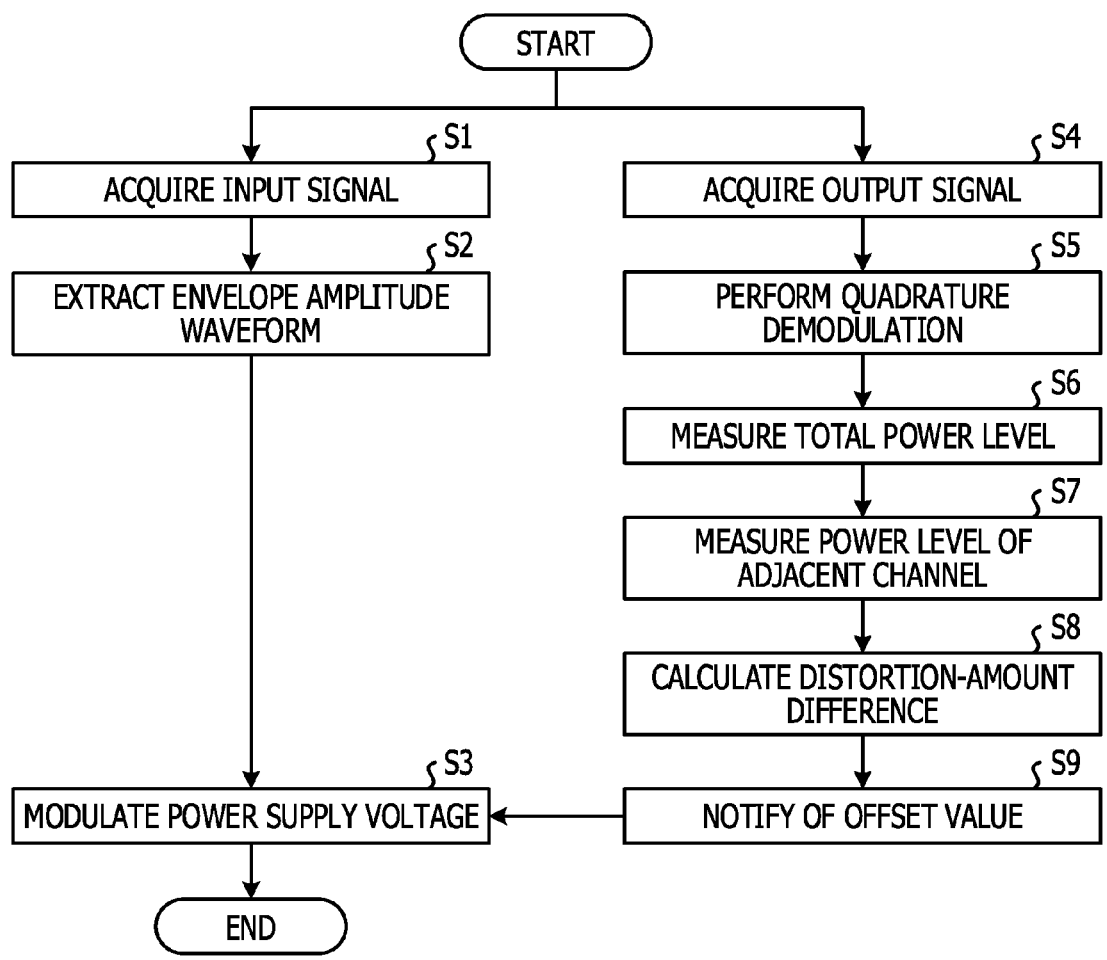
FIG. 10 is a diagram illustrating an example of operation performed by the radio communication circuit illustrated in FIG. 5.

FIG. 10 is a diagram illustrating an example of operation of the radio communication circuit illustrated in FIG. 5. As illustrated in FIG. 10, when the radio communication circuit 31 starts operation, the envelope detection circuit 34 acquires an input signal inputted to the radio communication circuit 31 (Step S1), extracts an envelope amplitude waveform of the input signal acquired, and sends the envelope amplitude waveform to the power supply voltage modulation circuit 35 (Step S2).

Meanwhile, when the radio communication circuit 31 starts the operation, the coupler 36 outputs a signal obtained by splitting an output signal from the power amplifier 33. The quadrature demodulator 37 acquires the output signal from the coupler 36 (Step S4), obtains a baseband signal by performing quadrature demodulation on the output signal acquired, and outputs the baseband signal (Step S5).

Next, the one level detection circuit 52 measures the total power level of the baseband signal inputted from the quadrature demodulator 37 (Step S6). Further, from the baseband signal inputted from the quadrature demodulator 37, the filter 51 extracts a signal on a channel adjacent to a channel for the output signal from the power amplifier 33. The other level detection circuit 53 measures the power level of the signal extracted by the filter 51, that is, the signal on the channel adjacent to the channel for the output signal from the power amplifier 33 (Step S7). One of the operation in Step S6 and the operation in Step S7 may be performed first, or both the operations may be performed simultaneously.

Next, the level ratio calculation circuit 54 calculates a ratio of the power level detected by the one level detection circuit 52 to the power level detected by the other level detection circuit 53 and thereby obtains a distortion amount occurring in the power amplifier 33. Subsequently, the subtractor 55 calculates a difference between the distortion amount calculated by the level ratio calculation circuit 54 and the target distortion amount 57, that is, a distortion-amount difference (Step S8). Then, the table 58 notifies the power supply voltage modulation circuit 35 of an offset value associated with a value of the distortion-amount difference (Step S9).

Next, the power supply voltage modulation circuit 35 creates power-supply-voltage modulation information based on the envelope amplitude waveform, and modulates a power supply voltage to be applied to the power amplifier 33, based on information obtained by adding the offset value to the power-supply-voltage modulation information (Step S3). With that, a sequence of operations ends. The operation in Step S1 to Step S2 and the operation in Step S4 to Step S9 are performed in parallel. Moreover, the operation in Step S1 to Step S9 may be iterated continuously or intermittently during the operation of the radio communication circuit 31.

According to the radio communication circuit 31 illustrated in FIG. 5, the envelope amplitude waveform of an input signal to the power amplifier 33 is corrected by use of an offset value associated with the distortion amount in an output signal from the power amplifier 33. Thus, when envelope tracking is used in supply of a power supply voltage to the power amplifier 33, the power supply voltage may be controlled in accordance with the distortion characteristics specific to the power amplifier 33. Hence, unlike the conventional technique, the desire no longer exists to give a margin that may absorb variations in individual power amplifiers 33 to a power supply voltage to be supplied to the power amplifier 33. In other words, regardless of whether the transmission power level of the radio communication circuit 31 indicates high output or low output, signals may be sent with power matching the transmission output level. Thus, an advantageous effect of improved power efficiency may be attained.

Moreover, a power supply voltage that makes the distortion amount fall within the range of the target distortion amount 57 may vary depending on the frequency or the individual difference of the power amplifier 33. However, according to the radio communication circuit 31 illustrated in FIG. 5, the power supply voltage may be controlled in accordance with the distortion characteristics of the power amplifier 33. Thus, there is no desire to obtain, in manufacturing, power supply voltages that make distortion amounts fall within the range of the target distortion amount 57 by experiment or the like in advance in accordance with the frequency or the individual difference of the power amplifier 33 and storing such power supply voltages in the radio communication circuit 31. Accordingly, an advantageous effect of improved efficiency in production of the radio communication circuit 31 may be attained. The improved production efficiency may offer an advantageous effect of inexpensively providing the radio communication apparatus having the radio communication circuit 31.

Moreover, the radio communication circuit 31 illustrated in FIG. 5 measures the power of an output signal from the power amplifier 33 and the power of a signal on a channel adjacent to a channel for the output signal from the power amplifier 33 and obtains the ratio between them. Accordingly, a distortion amount in the output signal from the power amplifier 33 may be obtained. Further, the radio communication circuit 31 illustrated in FIG. 5 may obtain an offset value by deriving the difference between the distortion amount in the output signal from the power amplifier 33 and the target distortion amount 57. Moreover, the radio communication circuit 31 illustrated in FIG. 5 may find, in the table 58, an offset value corresponding to the difference between the distortion amount in the output signal from the power amplifier 33 and the target distortion amount 57. Furthermore, according to the radio communication circuit 31 illustrated in FIG. 5, the filter 51 may extract the signal on the channel adjacent to the channel for the output signal from the power amplifier 33.

The radio communication circuit 31 may be one supporting a communication scheme other than WCDMA as long as it is a radio communication apparatus performing quadrature modulation and quadrature demodulation. In addition, the radio communication circuit 31 may not be a radio communication apparatus performing quadrature modulation and quadrature demodulation as long as it may detect a distortion amount in an output signal from the power amplifier 33.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A radio communication circuit comprising:
   a power amplifier configured to amplify a signal and output the amplified signal;
   an envelope detector configured to extract an envelope of an input signal inputted to the power amplifier;
   an offset generator configured to generate an offset value for a power supply voltage to be applied to the power amplifier, based on a distortion amount in an output signal from the power amplifier; and
   a power supply voltage modulator configured to control the power supply voltage to be applied to the power amplifier based on the envelope extracted and the offset value generated,
   wherein the distortion amount in the output signal from the power amplifier is expressed as a ratio between first power of the output signal from the power amplifier and second power of a signal on a channel adjacent to a channel for the output signal from the power amplifier.

2. The radio communication circuit according to claim 1, wherein the offset generator includes a quadrature demodulator configured to perform a quadrature demodulation on the amplified signal and a distortion judgment circuit configured to detect the distortion amount from an output of the quadrature demodulator.

3. The radio communication circuit according to claim 1, wherein the offset value is expressed as a value proportional to a difference between the distortion amount in the output signal from the power amplifier and a preset target distortion amount.

4. The radio communication circuit according to claim 3, further comprising:
   a memory that stores a table including the offset value associated with the difference between the distortion amount in the output signal from the power amplifier and the preset target distortion amount.

5. The radio communication circuit according to claim 1, further comprising:
   a filter configured to extract the signal on the channel adjacent to the channel for the output signal from the power amplifier.

6. A radio communication apparatus comprising:
   a radio communication circuit configured to amplify a signal by a power amplifier, extract an envelope of an input signal inputted to the power amplifier, generate an offset value for a power supply voltage to be applied to the power amplifier, based on a distortion amount in an output signal from the power amplifier, and control the power supply voltage to be applied to the power amplifier based on the extracted envelope and the generated offset value; and
   an antenna coupled to the radio communication circuit and configured to transmit the amplified signal,
   wherein the distortion amount in the output signal from the power amplifier is expressed as a ratio between power of the output signal from the power amplifier and power of a signal on a channel adjacent to a channel for the output signal from the power amplifier.

7. The radio communication circuit according to claim 2, wherein the distortion judgment circuit includes a first level detection circuit configured to detect a power level of an output of the quadrature demodulator as the first power and a second level detection circuit configured to detect a power level of an output of a filter which receives the output of the quadrature demodulator as the second power.

8. The radio communication circuit according to claim 7, wherein the distortion judgment circuit includes a level ratio calculation circuit calculates the ratio of the power level detected by the first level detection circuit to the power level detected by the second level detection circuit.

9. The radio communication apparatus according to claim 6, wherein the offset value is expressed as a value proportional to a difference between the distortion amount in the output signal from the power amplifier and a preset target distortion amount.

10. The radio communication apparatus according to claim 9, further comprising:
a memory that stores a table including the offset value associated with the difference between the distortion amount in the output signal from the power amplifier and the preset target distortion amount.

11. The radio communication apparatus according to claim 6, wherein the radio communication circuit includes a filter configured to extract the signal on the channel adjacent to the channel for the output signal from the power amplifier.

12. The radio communication apparatus according to claim 6, wherein the radio communication circuit includes a quadrature demodulator configured to perform a quadrature demodulation on an amplified signal from the power amplifier and a distortion judgment circuit configured to detect the distortion amount from an output of the quadrature demodulator.

13. The radio communication apparatus according to claim 12, wherein the distortion judgment circuit includes a first level detection circuit configured to detect a power level of an output of the quadrature demodulator as the first power and a second level detection circuit configured to detect a power level of an output of a filter which receives the output of the quadrature demodulator as the second power.

14. The radio communication apparatus according to claim 13, wherein the distortion judgment circuit includes a level ratio calculation circuit calculates the ratio of the power level detected by the first level detection circuit to the power level detected by the second level detection circuit.

* * * * *